US009577649B1

(12) United States Patent
Liong et al.

(10) Patent No.: US 9,577,649 B1
(45) Date of Patent: Feb. 21, 2017

(54) METHODS AND APPARATUS FOR REDUCING POWER IN CLOCK DISTRIBUTION NETWORKS

(71) Applicant: Altera Corporation, San Jose, CA (US)

(72) Inventors: Boon Pin Liong, Simpang Ampat (MY); Chooi Pei Lim, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/069,082

(22) Filed: Mar. 14, 2016

(51) Int. Cl.
*H03L 7/00* (2006.01)
*H03L 7/08* (2006.01)
*H03L 7/091* (2006.01)
*H03L 7/095* (2006.01)
*H03K 5/1534* (2006.01)

(52) U.S. Cl.
CPC .......... *H03L 7/0802* (2013.01); *H03K 5/1534* (2013.01); *H03L 7/0807* (2013.01); *H03L 7/091* (2013.01); *H03L 7/095* (2013.01)

(58) Field of Classification Search
None
See application file for complete search history.

(56) References Cited

U.S. PATENT DOCUMENTS

| 5,453,742 | A | * | 9/1995 | Cox | ......................... | H03M 5/08 |
| | | | | | | 341/64 |
| 5,640,388 | A | * | 6/1997 | Woodhead | ............ | H04J 3/0673 |
| | | | | | | 348/464 |
| 6,608,528 | B2 | | 8/2003 | Tam et al. | | |
| 6,795,517 | B1 | | 9/2004 | Marshall | | |
| 7,368,961 | B2 | | 5/2008 | Werner et al. | | |
| 7,555,667 | B1 | * | 6/2009 | Burney | ..................... | G06F 1/12 |
| | | | | | | 713/401 |
| 7,764,095 | B2 | | 7/2010 | Werner et al. | | |
| 8,643,414 | B1 | | 2/2014 | Navid | | |

* cited by examiner

*Primary Examiner* — Cassandra Cox
(74) *Attorney, Agent, or Firm* — Treyz Law Group, P.C.; Jason Tsai

(57) ABSTRACT

Integrated circuits with clock distribution circuitry are provided. The clock distribution circuitry may include a clock source, a clock distribution network, a frequency encoder placed at the output of the clock source, and one or more frequency decoders placed at the destinations of the clock distribution network. The frequency encoder can be used to obtain calibrated delay settings proportional to a reference clock generated by the clock source. Each frequency decoder can be placed in a closed loop configuration and can use the calibrated delay settings to locally self-generate a recovered clock at the destination during a locked state. During the locked state, clock buffers in the clock distribution network can be powered down to save power.

20 Claims, 7 Drawing Sheets

METHODS AND APPARATUS FOR REDUCING POWER IN CLOCK DISTRIBUTION NETWORKS

BACKGROUND

This relates generally to integrated circuits, and more particularly, to integrated circuits with clock signal distribution circuitry.

Integrated circuit often include clock generation circuitry such as phase-locked loops (PLLs). A phase-locked loop typically has an input that receives a reference clock signal and outputs at which multiple clocks signals are provided. The multiple clocks signals generated at the outputs of the phase-locked loop can exhibit clock rates that are integer multiples of the clock rate of the input reference clock signal.

The clock signals generated using the phase-locked loop can be distributed to different regions on an integrated circuit on which the phase-locked loop is formed using clock distribution circuitry—sometimes referred to as the clock network. The clock network can include many branches of series-connected clock buffers (i.e., clock buffers connected serially in a chain) through which the clock signals are passed. Because the clock signals propagating through the clock network constantly toggle between logic low and logic high levels, the clock network is a significant contributor to the total dynamic power loss of the integrated circuit. Typically, the clock distribution network can consume up to 60% of the total chip power. This percentage is exacerbated as semiconductor technology scales toward higher density designs and as the need for higher performance devices continues to push operating frequencies higher.

It is within this context that the embodiments described herein arise.

SUMMARY

This relates generally to integrated circuits and, more particularly, to integrated circuits with clock distribution circuitry. In accordance with an embodiment, an integrated circuit may include a clock generation circuit that generates a reference clock signal, a clock distribution network that receives the reference clock signal and that distributes the reference clock signal to different regions on the integrated circuit, a frequency encoder that receives the reference clock signal from the clock generation circuit and that performs delay calibration on the reference clock signal, and a frequency decoder that is formed in one of the different regions, that actively receives that reference clock signal before the delay calibration is complete, and that self-generates a recovered clock signal without receiving the reference clock signal after the delay calibration is complete.

In accordance with another embodiment, a method of operating an integrated circuit is provided that includes: outputting a reference clock with a clock generation circuit, distributing the reference clock to different portions of the integrated circuit with a clock distribution network, performing calibration on the reference clock signal to obtain calibrated delay settings with a frequency encoder, and using the calibrated delay settings to control a frequency decoder formed in one of the different portions while the clock distribution network is deactivated.

In accordance with yet another suitable embodiment, an integrated circuit die may include a clock source that generates a reference clock signal, a clock distribution network that distributes the reference clock signal to different destinations on the integrated circuit die, a frequency encoder that calibrates the reference clock signal, and a frequency decoder at one of the destinations that operates in an open loop configuration in a first mode and that operates in a closed loop configuration in a second mode. The clock distribution network can be activated during the first mode and can be deactivated during the second mode.

Further features of the invention, its nature and various advantages will be more apparent from the accompanying drawings and following detailed description.

DETAILED DESCRIPTION

Embodiments of the present invention relate to ways for controlling a clock distribution network on an integrated circuit die to help reduce the total dynamic power consumption. An integrated circuit die may be provided with a clock generation circuit (e.g., a phase-locked loop), a clock distribution network having many buffer chains, an associated frequency encoder place at the clock source, and one or more frequency decoders place at the destination (depending on how much clock regions need to be served).

The clock generation circuit may be used to generate a reference clock signal. The frequency encoder may be used to effectively measure the pulse width of the reference clock signal and produce corresponding calibrated delay settings. The frequency encoder is said to have "locked" once the calibrated delay settings have been identified and stored.

The calibrated delay settings can be used to set a variable delay line in the frequency decoder. Upon locking, the frequency decoder receives a training pulse of the reference clock signal from the frequency encoder and is then able to self-generate the reference clock signal at the destination by locally forming a closed feedback loop.

Once the clock self-generation at the frequency decoder is stable, the clock source switching activities in the rest of the clock distribution network (e.g., the multiple chains of clock buffers between the source and the destination) can be shut down to help dramatically reduce dynamic power consumption.

It will be recognized by one skilled in the art, that the present exemplary embodiments may be practiced without some or all of these specific details. In other instances, well-known operations have not been described in detail in order not to unnecessarily obscure the present embodiments.

Figure 1:
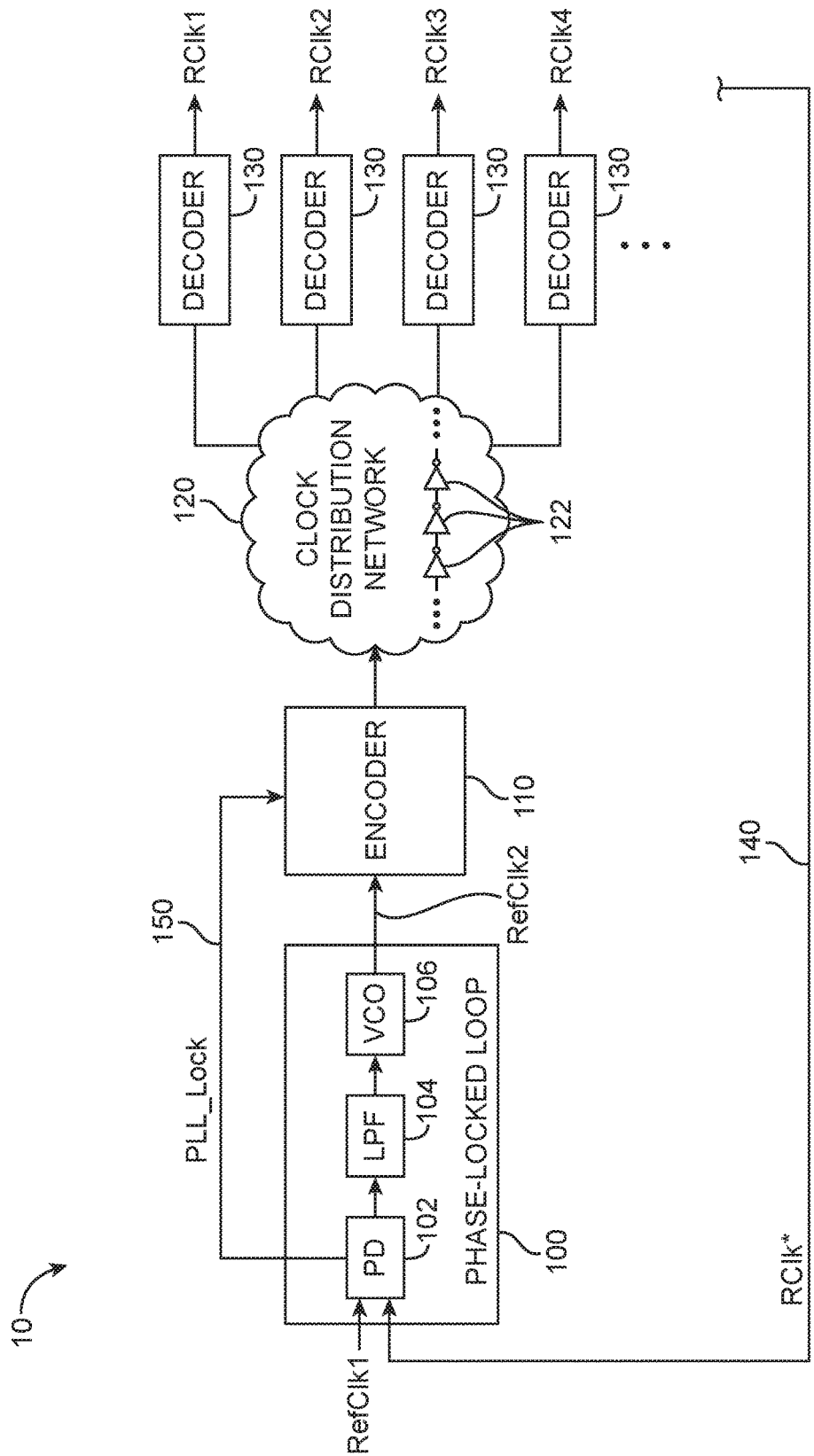
FIG. 1 is a diagram of an illustrative integrated circuit that includes clock generation circuitry, clock distribution network circuitry, and associated encoder and decoder circuitry in accordance with an embodiment.

FIG. 1 is a diagram of an illustrative integrated circuit that includes clock generation circuitry, clock distribution network circuitry, and associated encoder and decoder circuitry in accordance with an embodiment. As shown in FIG. 1, integrated circuit 10 may include a clock generation circuit such as a phase-locked loop (PLL) 100, clock distribution circuitry such as clock distribution network 120 that distributes clock signals to multiple respective destination regions on chip 10, an encoder circuit such as clock frequency encoder 110 interposed between phase-locked loop 100 and clock distribution network 120, and multiple decoder circuits such as clock frequency decoders 130 placed at the respective destinations (sometimes referred to as clock "leaves").

Phase-locked loop 100 may, for example, include phase detector (PD) 102, low pass filter (LPF) 104, and voltage-controlled oscillator (VCO) 106 coupled in a loop. In particular, PLL 100 may receive an input reference clock signal RefClk1 (typically from an off-chip clock source such as a crystal oscillator) to generate a corresponding internal reference clock signal RefClk2. Internal reference clock signal may generally have a clock frequency that is some integer multiple of input reference clock RefClk1. In general, clock RefClk2 may represent one or more clock signals generated by PLL 100. If desired, integrated circuit 10 include more than one PLL 100.

Clock RefClk2 may be distributed to different regions on device 10. For example, phase-locked loop 100 may feed clock signal RefClk2 to clock distribution network 120 that serves to route the clock signals to different logic regions of integrated circuit die 10 via multiple branches consisting of series-connected clock buffers (or drivers) 122. Network 120 may be arranged in a tree configuration (sometimes referred to as a clock tree). Network 16 may, for example, be an H-tree clock network or other suitable types of balanced distribution network. Use of such balanced distribution networks ensures that delays to the different logic regions are well matched.

Clock signals routed to a destination logic region may sometimes be referred to as a regional clock signal. In the example of FIG. 1, the clock signal routed through a first branch in network 120 to a first destination logic region is represented as first regional clock signal RClk1; the clock signal routed through a second branch in network 120 to a second destination logic region is represented as second regional clock signal RClk2; the clock signal routed through a third branch in network 120 to a third destination logic region is represented as third regional clock signal RClk3; and so on. As described above, each destination logic region receiving a regional clock signal may be referred to as a clock leaf.

One or more of the regional clock signals RClk* may be fed back to PLL 100 via feedback path 140 to ensure proper phase alignment between input clock source signal RefClk1 and destination clock signal RClk* (e.g., phase detector 102 may be used to compare the phases of signals RClk* and RefClk1).

In accordance with an embodiment, die 10 may be provided with frequency encoder 110 placed at the clock source and multiple frequency decoders 130 placed at each respective clock leaf. Encoder 110 may be configured to perform clock signal calibration by performing initialization operations to calibrate the pulse width, duty cycle, or clock period of signal RefClk2. When calibration is complete, encoder may send calibrated settings to each decoder 130 to enable them to self-generate local regional clock signals without having to activate clock distribution network 120. This helps to substantially cut down on dynamic power consumption on die 10. Recalibration may be automatically triggered when PLL 100 detects a misalignment issue between RefClk1 and RClk*; in response, PLL 100 will trigger recalibration by asserting recalibration signal PLL_Lock provided over path 150.

Figure 2:
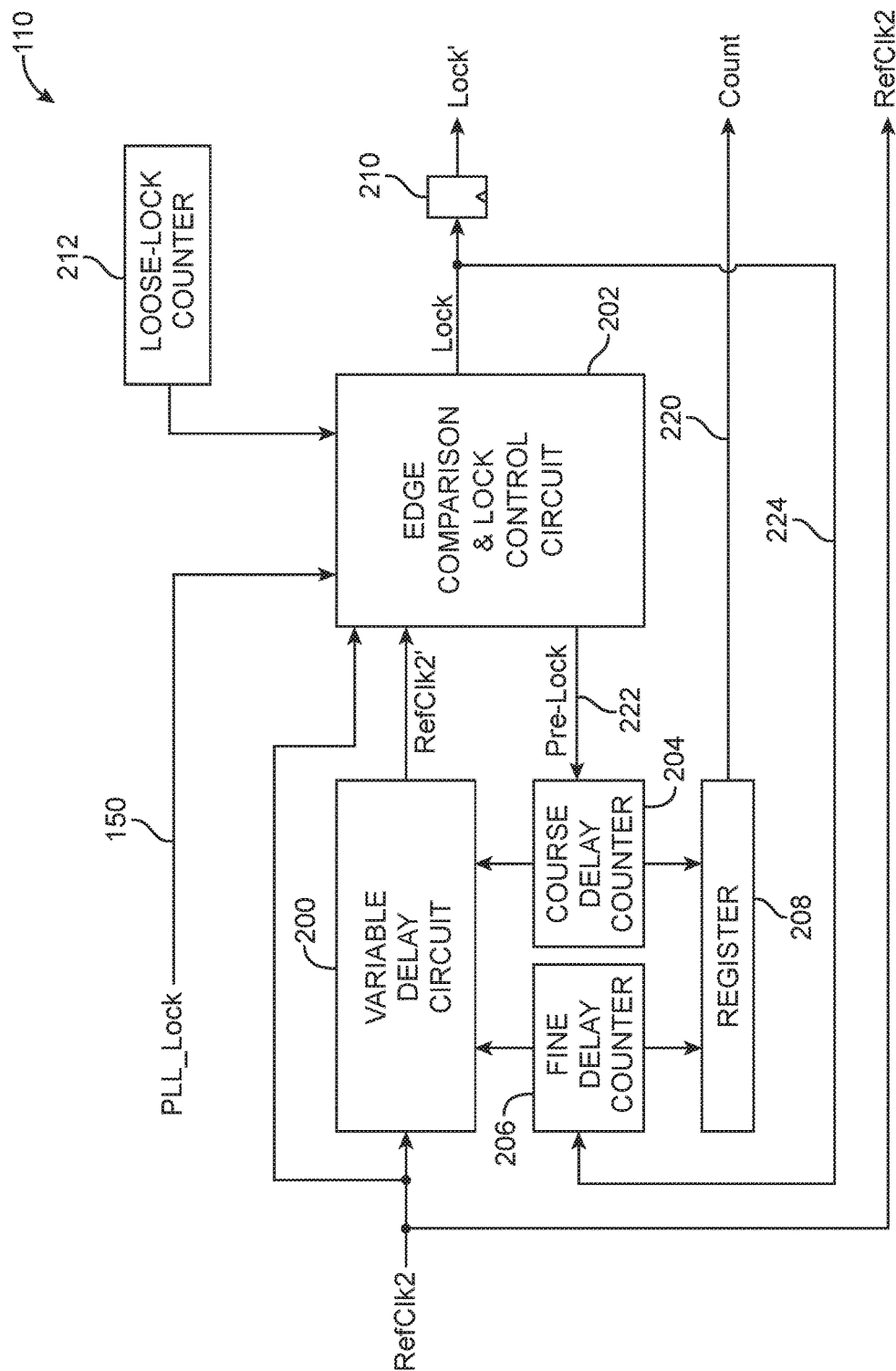
FIG. 2 is a diagram of an illustrative clock distribution network encoder circuit in accordance with an embodiment.

FIG. 2 is a diagram of an illustrative clock distribution network encoder circuit such as frequency encoder 110. As shown in FIG. 2, frequency encoder 110 may include variable delay circuit 200, edge comparison and lock control circuit 202, delay control circuitry including coarse delay counter 204 and fine delay counter 206, register 208 for storing the coarse and fine delay counter settings, and output register 210. Variable delay circuit 200 may have a data input that receives clock signal RefClk2 from PLL 100 (see, e.g., FIG. 1) and that delays signal RefClk2 to produce a corresponding delayed clock signal RefClk2'. The amount of delay between input signal RefClk2 and output signal RefClk2' is controlled by the count output values of coarse delay counter 204 and fine delay counter 206. Each increment in coarse delay counter 204 will further delay signal RefClk2' by a first predetermined amount, whereas each increment in fine delay counter 206 will further delay signal RefClk2' by a second predetermined amount that is less than the first predetermined amount (e.g., the fine delay counter provides higher tuning accuracy compared to the coarse delay counter).

Edge comparison and lock control circuit 202 may receive signal RefClk2 and also delayed signal RefClk2' from variable delay circuit 200. Control circuit 202 may have a first output on which signal Pre-Lock is provided and a second output on which signal Lock is provided. Signals Pre-Lock and Lock are initially deasserted (e.g., the pre-lock signal and the lock signal are reset to logic "0" by default).

When the pre-lock signal is deasserted, coarse delay counter 204 is allowed to increment until the rising edge of signal RefClk2' lines up with the falling edge of signal RefClk2. Since the coarse delay step size is relatively large, the rising edge of signal RefClk2' is sometimes pushed past the falling edge of signal RefClk2, so it may be desirable to then decrement the coarse delay count by one prior to disabling coarse delay counter 204. Coarse delay counter 204 stops counting when control circuit 202 asserts the pre-lock signal upon detection of edge alignment and after decrementing the coast delay count (e.g., coarse delay counter 204 is disabled via control line 222).

Following assertion the pre-lock signal, fine delay counter 206 is allowed to increment—now with relatively finer resolution compared to the coarse delay step size—until the rising edge of signal RefClk2' lines up with the falling edge of signal RefClk2. Control circuit 202 may assert the lock signal in response to detecting edge alignment between signals RefClk2 and RefClk2'. Assertion of signal Lock stops fine delay counter 206 from further incrementing (e.g., fine delay counter 206 is disabled via control line 224). Signal Lock may also be latched using output register (e.g., digital flip-flop) 210 to generate signal Lock'.

Configured in this way, the combined output of coarse delay counter 204 and fine delay counter 206 effectively represents an amount of delay that is equivalent to a half a clock period of signal RefClk2. The combined counter output can then be stored in register 208 as calibrated delay settings. The calibrated delay settings may then be output over line 220 as signal Count. This calibrated delay setting can then be doubled at variable delay line 200* so that the delay setting at the decoder is equal to a whole clock period to ensure generation of a clock signal with 50% duty cycle. The example described above in which edge comparison control circuit 202 measures half a clock period of signal RefClk2 is merely illustrative. In other suitable embodiments, control circuit 202 may be configured to calibrate/measure a whole clock period of signal RefClk2 (e.g., by aligning the rising edge of signal RefClk2' to the rising edge of signal RefClk2"). A programmable integrated circuit can be provided with both of these options via programmable switches that can be configured by the user.

Still referring to FIG. 2, encoder 110 may also include a periodic reset counter such as loose-lock counter 212. Similar to the reset function of signal PLL_Lock (as described above in connection with FIG. 1), loose-lock counter 212 may be configured to periodically trigger recalibration to confirm the accuracy of the entire clock system whenever a predetermined count threshold is reached. The predetermined threshold of counter 212 may be programmable. For example, the threshold may be lowered to increase the occurrence of recalibration or may be increased to reduce the occurrence of recalibration. If desired, loose-lock counter 212 may be switched out of use to disable the periodic loose-lock function to further improve power savings.

Figure 3:
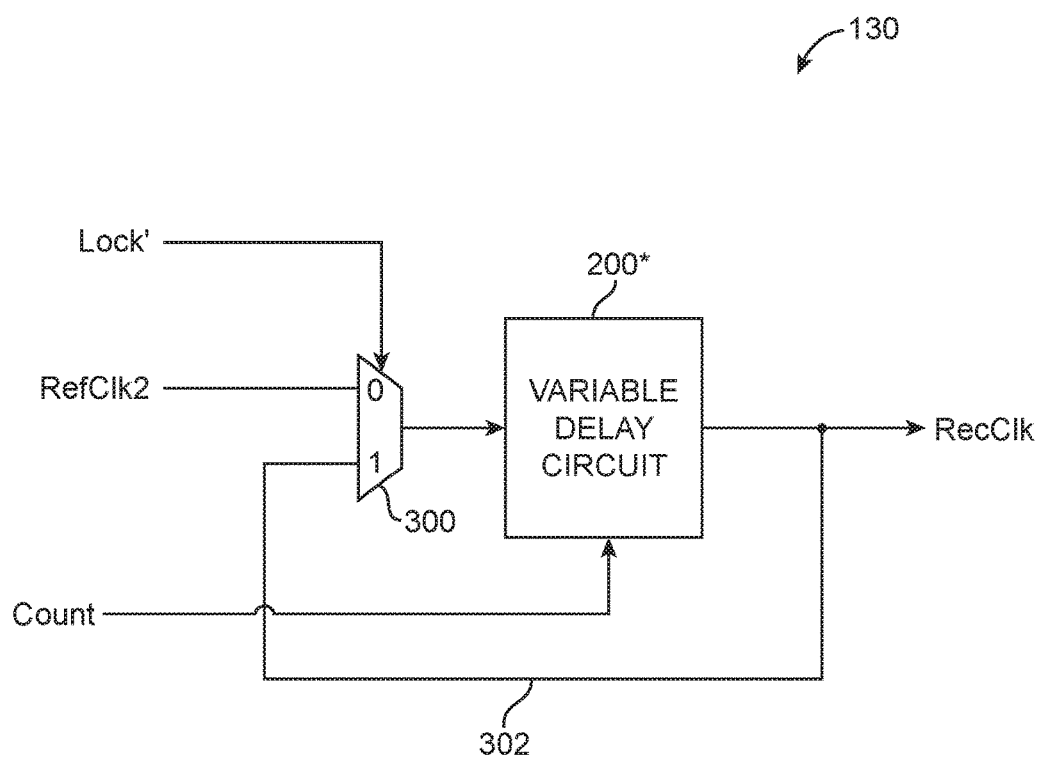
FIG. 3 is a diagram of an illustrative clock distribution network decoder circuit in accordance with an embodiment.

FIG. 3 is a diagram of an illustrative clock distribution network decoder circuit such as frequency decoder 130 in accordance with an embodiment. As shown in FIG. 3, frequency decoder 130 can include an adjustable delay circuit such as variable delay circuit 200* and a multiplexing circuit such as multiplexer 300. In particular, variable delay circuit 200* may be a replica of variable delay circuit 200 within frequency encoder 110 (i.e., variable delay circuits 200 and 200* are structurally identical). Configured as such, calibrated delay settings Count stored in register 208 (see FIG. 2) can be provided to variable delay circuit 200* to apply a delay amount that is equivalent to the calibrated clock period of signal RefClk2.

Multiplexer 300 may have a first (0) data input that receives signal RefClk2, a second (1) data input, a control input that receives latched signal Lock' from flip-flop 210, and an output that connected to variable delay circuit 200*. Variable delay circuit 200* has an output that is coupled to the second data input of multiplexer 300 via feedback path 302. When signal Lock' is deasserted (i.e., when Lock' is low), signal RefClk2 at the first data input will be routed to the output of multiplexer 300 and passed through variable delay circuit 200*.

When signal Lock is asserted (i.e., when Lock' is set high to signify completion of the calibration operation), multiplexer 300 may route signals from its second data input to its output, thereby forming a closed feedback loop. When decoder 130 is configured in the closed loop state, decoder 130 behaves like a ring oscillator and is able to self-generate a recovered clock signal RecClk that is a mirror image of RefClk2 at the destination without actually having to actively receive RefClk2. Thus, when decoder 130 is configured in the closed oscillating loop, the clock distribution network (including any intermediate clock buffers and drivers) can be deactivated to save power.

Figure 4:
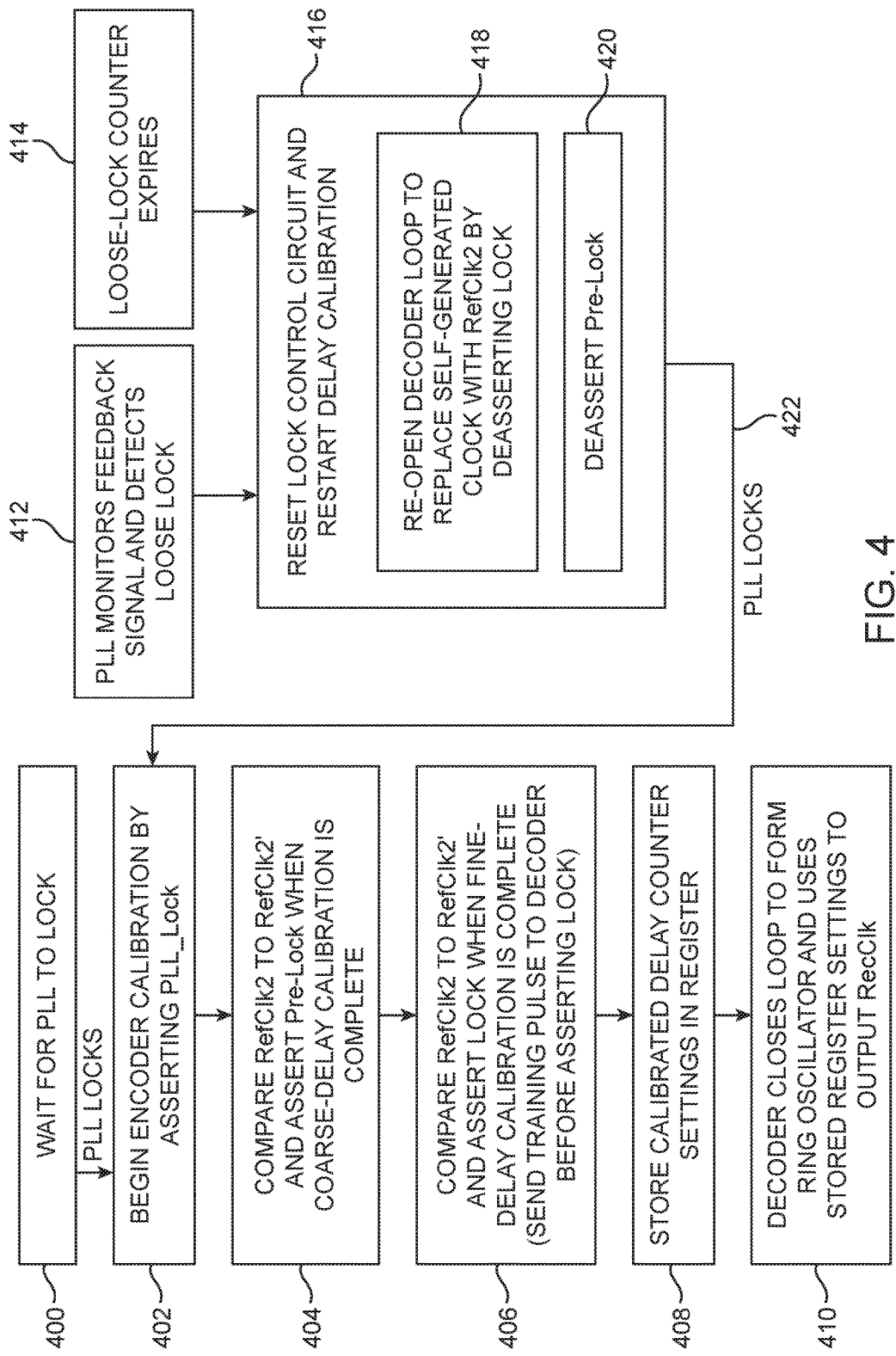
FIG. 4 is a flow chart of illustrative steps for operating the clock distribution network encoder and decoder circuits in accordance with an embodiment.

FIG. 4 is a flow chart of illustrative steps for operating clock distribution network encoder 110 and decoder 130 in accordance with an embodiment. Initially, all control signals including PLL_Lock, the output of loose-lock counter 212, signals Pre-lock and Lock, and delay settings Count may all be reset to zero. At step 400, PLL 100 may be waiting to lock. In response to PLL 100 locking (i.e., when RefClk1 and RClk* are phase and frequency aligned), encoder calibration is initiated by asserting signal PLL_Lock (step 402).

At step 404, edge comparison and lock control circuit 202 may compare signals RefClk2 and RefClk2' and assert the pre-lock signal when the coarse delay calibration is complete. The count output of coarse delay counter 204 may be decremented by one after the pre-lock signal is asserted. At step 406, edge comparison and lock control circuit 202 may continue to compare signals RefClk2 and RefClk2' and assert the lock signal when the fine delay calibration is complete. While signal Lock is being asserted, a single training pulse may be sent from encoder 110 to decoder 130 immediately prior to decoder 130 closing its feedback loop.

At step 408, the calibrated delay settings obtained at coarse delay counter 204 and fine delay counter 206 may be stored in register 208 within encoder 110. These settings—represented as signal Count—may be provided to variable delay circuit 200* within decoder 130. At step 410, decoder 130 may then close its feedback loop as soon as the lock signal is asserted and may use the registered settings Count to output recovered clock signal RecClk.

Still referring to FIG. 4, recalibration can either be triggered when PLL 100 detects a faulty lock at one of the destination clock leaves (scenario 412) or when loose-lock counter expires (scenario 414). In either scenario, control circuit 202 will be reset to restart calibration at step 416. In particular, frequency decoder 130 may open its feedback loop to replace the self-generated clock with signal RefClk2 by deasserting the lock signal (step 418). The pre-lock signal may also be deasserted to enable both the coarse and fine delay counters. Step 416 may also include resetting the count values of both the coarse and fine delay counters, resetting loose-lock counter 212, resetting register 208, etc. Once the requisite reset operations have been performed, processing may loop back to step 402 to begin recalibrating encoder 110 and decoder(s) 130 (as indicated by path 422).

Figure 5:
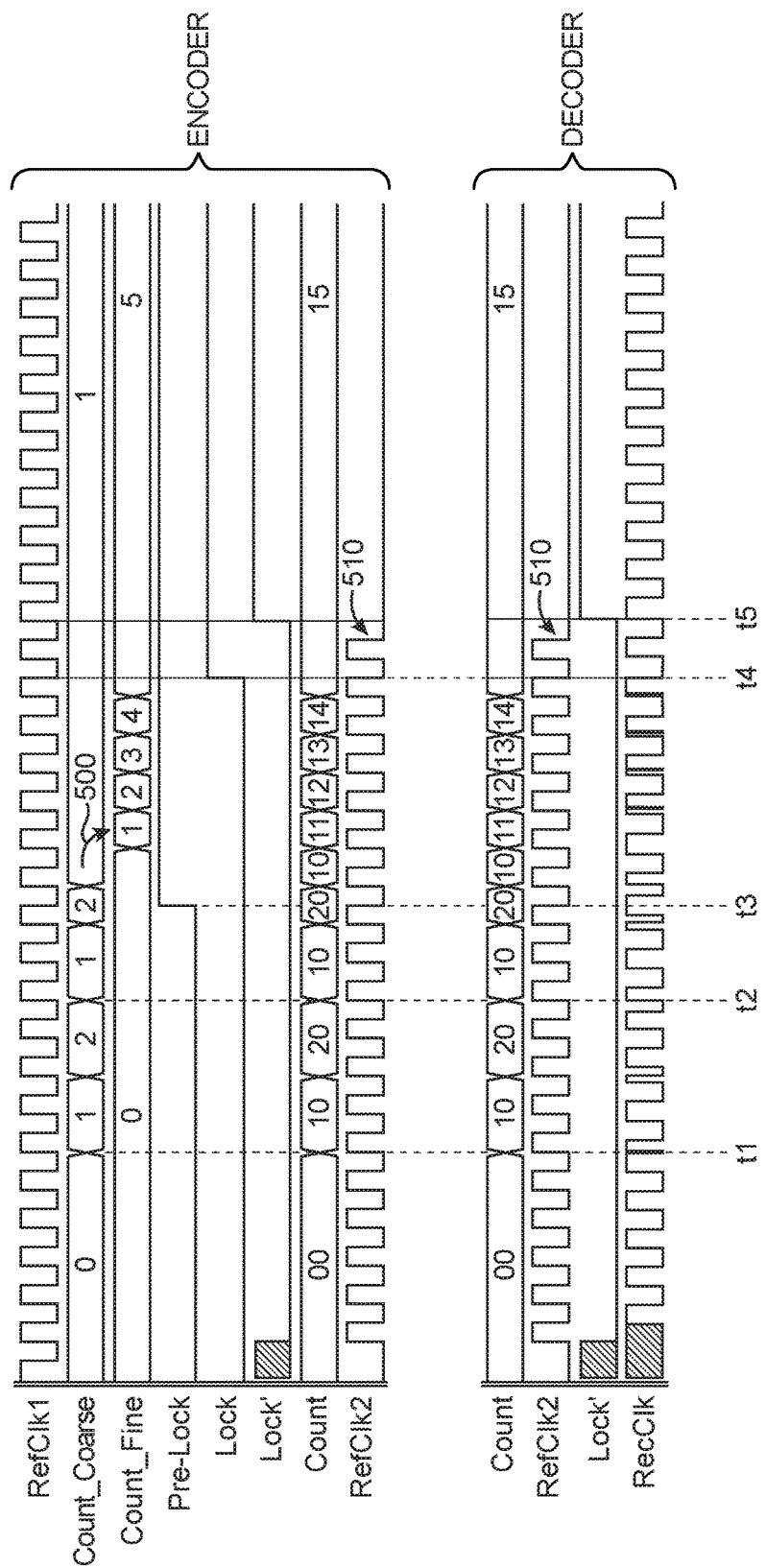
FIG. 5 is a timing diagram illustrating relevant waveforms associated with the operation of the clock distribution network encoder and decoder circuits in accordance with an embodiment.

FIG. 5 is a timing diagram illustrating relevant waveforms associated with the operation of the clock distribution network frequency encoder and decoder circuitry shown in FIGS. 1-3. Note that signal Count is a concatenation of the count value Count_Coarse of coarse delay counter 204 (as the most significant bits) with the count value Count_Fine of the fine delay counter 206 (as the least significant bits).

Prior to time t1, the entire clock distribution system shown in FIG. 1 may be initialized to its default state (e.g., PLL 100 has been reset; coarse delay counter 204 has been reset; loose-lock counter has been reset; signal PLL_Lock is deasserted; signal Pre-Lock is deasserted, signal Lock is deasserted, so each decoder 130 is not in the closed feedback loop).

At time t1, calibration begins when signal Count_Coarse starts to increment (i.e., when coarse delay counter 204 starts counting). At time t2, edge comparison control circuit 202 detects an edge alignment between signal RefClk2 and signal RefClk2' (not shown in FIG. 5 so as to not unnecessarily obscure the present embodiments). In this particular example, coarse delay counter 204 double checks the edge alignment by decrementing signal Count_Coarse and then re-incrementing Count_Coarse to confirm the coarse alignment. Double-checking in this way is not required but helps improve alignment accuracy.

At time t3, the pre-lock signal is asserted, which decrements signal Count_Coarse by one (as indicated by arrow 500) to allow fine delay counter 204 to perform edge alignment. Fine delay counter 206 then starts counting (e.g., fine delay counter 206 is enabled when signal Pre-Lock goes high). Fine delay counter 206 will keep counting until edge alignment is reached (at time t4). When fine alignment is complete, signal Count—the combined signal of the coarse count value and the fine count value—is stored in register 208 and is provided as a calibrated delay setting to variable delay circuit 200*. At this time, signal Lock is also asserted.

When signal Lock is asserted, there will be a one cycle lag until signal Lock' is asserted at the output of flip-flop 210 (at time t5). Between time t4 and t5, a single training pulse 510 from signal RefClk2 will be passed through variable delay circuit 200* in decoder 130. When signal Lock' is asserted at time t5, multiplexer 300 closes feedback loop 302 and decoder 130 is now operating as a closed-loop oscillator to self-generate recovered clock signal RecClk. Since variable delay circuit 200* is controlled with the calibrated delay settings, which should provide a delay that is equal to the clock cycle of signal RefClk2, decoder 130 effectively turns the single training pulse into a periodic signal that is effectively identical to clock signal RefClk2.

After time t5, clock distribution network 120 (see FIG. 1) may be temporarily powered down, so signal RefClk2 remains low. As shown in FIG. 5, recovered clock RecClk following time t5 is identical to PLL reference signal Ref-Clk2 prior to locking.

Figure 6:
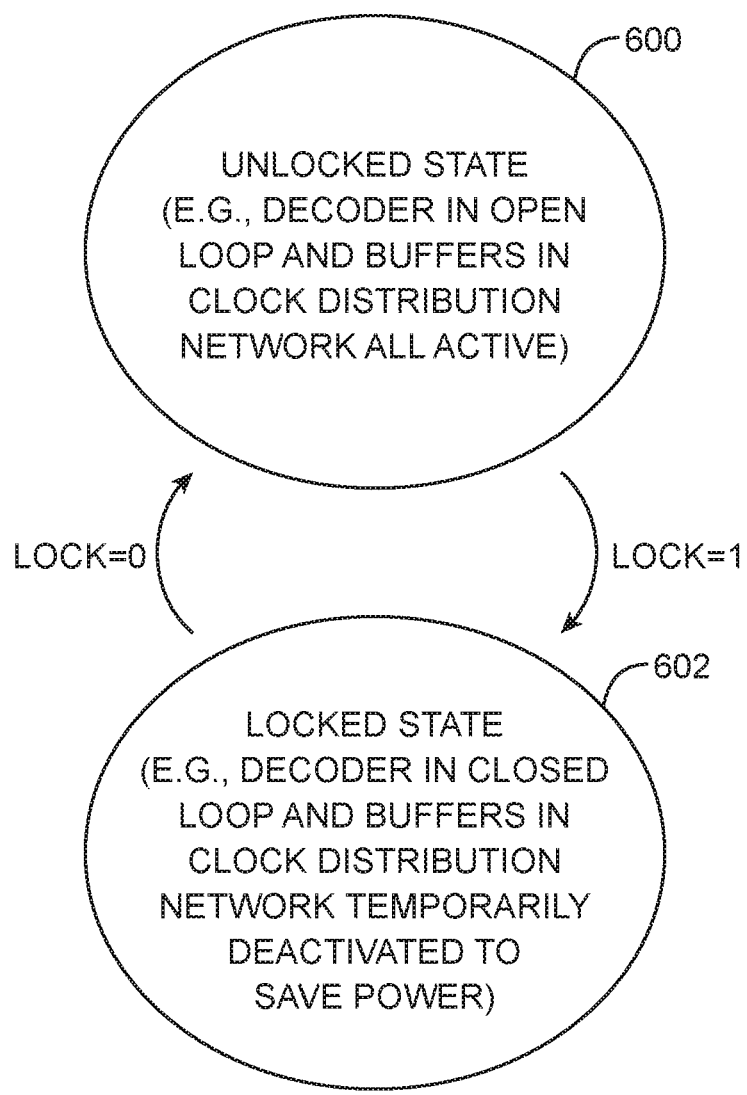
FIG. 6 is a diagram showing how an integrated circuit may be operated in an unlocked state and a locked state in accordance with an embodiment.

FIG. 6 is a diagram showing how integrated circuit 10 as shown in FIGS. 1-3 can be operated in at least an unlocked state and a locked state in accordance with an embodiment. In unlocked state 600, the lock signal at the output of control circuit 202 is deasserted, so decoder 130 is configured in an open loop configuration. In state 600, the entire clock distribution network 120 is active (e.g., all clock buffers and drivers are powered on).

As shown as calibration is complete, control circuit 202 can assert the lock signal, which places die 10 in locked state 602. In locked state 602, decoder 130 is configured in a closed loop configuration. While operating in state 602, clock distribution network 120 can be temporarily deactivated to save power. This is possible since decoder 130 at each destination clock leaf is able to locally self-generate recovered clock signal RecClk without receiving from the clock source. Die 10 may return to unlocked state 600 whenever a loose lock is detected (either by PLL 100 or when the loose-lock counter expires at step 414 as shown in FIG. 4), which effectively deasserts the lock signal.

Figure 7:
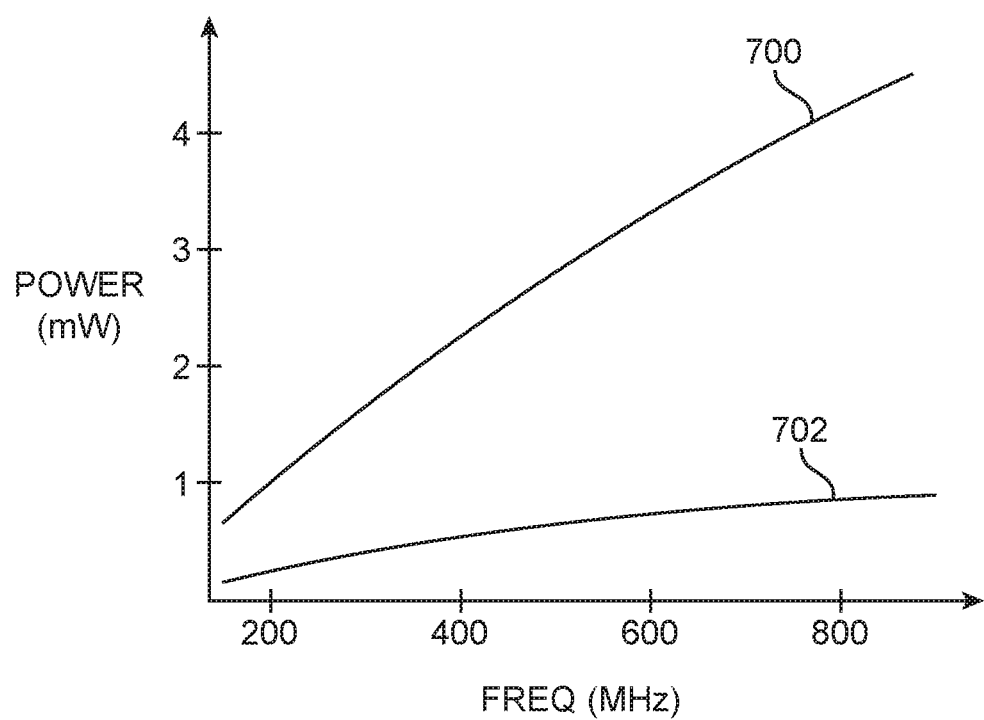
FIG. 7 is a plot showing the power savings that can be provided by selectively operating an integrated circuit in the locked state during which a substantial portion of the clock distribution network can be deactivated in accordance with an embodiment.

FIG. 7 is a plot showing the power savings that can be provided by selectively operating integrated circuit 10 in locked state 602 during which a substantial portion of the clock distribution network can be deactivated. Curve 700 shows the power consumption as a function of frequency if clock distribution network 120 is always turned on during normal operation of chip 10. Curve 702, on the other hand, shows the power consumption as a function of frequency if clock distribution network 120 is deactivated during locked state 602 described in connection with FIG. 6. As shown in FIG. 7, the techniques presented herein can provide almost a 10X power reduction.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art. The foregoing embodiments may be implemented individually or in any combination.

What is claimed is:

1. An integrated circuit, comprising:
   a clock generation circuit that generates a reference clock signal;
   a clock distribution network that receives the reference clock signal and that distributes the reference clock signal to different regions on the integrated circuit;
   a frequency encoder that receives the reference clock signal from the clock generation circuit and that performs delay calibration on the reference clock signal; and
   a frequency decoder that is formed in one of the different regions, that actively receives the reference clock signal via the clock distribution network before the delay calibration is complete, and that self-generates a recovered clock signal without receiving the reference clock signal from the clock distribution network after the delay calibration is complete.

2. The integrated circuit of claim 1, wherein the frequency encoder includes a first variable delay circuit, and wherein the frequency decoder includes a second variable delay circuit that is a replica of the first variable delay circuit.

3. The integrated circuit of claim 2, wherein the frequency encoder further includes:
   an edge comparison and lock control circuit that receives the reference clock signal and a delayed version of the reference clock signal through the first variable delay circuit and that determines when an edge of the reference clock signal has aligned with an edge of the delayed version of the reference clock signal.

4. The integrated circuit of claim 3, wherein the edge comparison and lock control circuit outputs a lock signal that is deasserted prior to edge alignment between the reference clock signal and the delayed version of the reference clock signal and that is asserted upon edge alignment.

5. The integrated circuit of claim 4, wherein the frequency decoder further includes:
   a multiplexing circuit that passes through the reference clock signal to the second variable delay circuit in a first mode and that passes through a signal fed back from an output of the second variable delay circuit in a second mode, wherein the multiplexing circuit is controlled by the lock signal.

6. The integrated circuit of claim 5, wherein the clock distribution network includes a plurality of clock buffers that is turned on during the first mode and that is turned off during the second mode.

7. The integrated circuit defined in claim 1, wherein the frequency encoder includes a loose-lock counter that periodically triggers delay recalibration.

8. The integrated circuit defined in claim 1, further comprising:
additional frequency decoders formed in other regions of the integrated circuit, wherein the frequency decoder and the additional frequency decoders are all controlled by the same control signals.

9. A method of operating an integrated circuit, comprising:
with a clock generation circuit, outputting a reference clock;
with a clock distribution network, distributing the reference clock to different portions of the integrated circuit;
with a frequency encoder, performing calibration on the reference clock signal to obtain calibrated delay settings; and
using the calibrated delay settings to control a frequency decoder formed in one of the different portions while the clock distribution network is deactivated.

10. The method of claim 9, further comprising:
with a first variable delay circuit in the frequency encoder, delaying the reference clock; and
with a second variable delay circuit in the frequency decoder that is structurally identical to the first variable delay circuit, delaying the reference clock.

11. The method of claim 10, further comprising:
with an edge comparison and lock control circuit in the frequency encoder, comparing the reference clock to a delayed version of the reference clock fed through the first variable delay circuit.

12. The method of claim 11, further comprising:
using a coarse delay counter in the frequency encoder to perform coarse alignment operations; and
after performing coarse alignment operations, using a fine delay counter in the frequency encoder to perform fine alignment operations having an accuracy that is greater than the coarse alignment operations.

13. The method of claim 12, further comprising:
in response to completion of the fine alignment operations, asserting a lock signal with the edge comparison and lock control circuit that places the frequency decoder in a closed loop oscillator configuration.

14. The method of claim 9, wherein the clock generation circuit comprises a phase-locked loop, the method further comprising:
in response to detecting clock misalignment at the frequency decoder, using the phase-locked loop to trigger recalibration of the reference clock signal at the frequency encoder.

15. The method of claim 9, further comprising:
with a loose-lock counter in the frequency encoder, periodically triggering recalibration of the reference clock signal at the frequency encoder.

16. An integrated circuit die, comprising:
a clock source that generates a reference clock signal;
a clock distribution network that distributes the reference clock signal to a plurality of destinations on the integrated circuit die;
a frequency encoder that calibrates the reference clock signal; and
a frequency decoder at one of the destinations that operates in an open loop configuration in a first mode and that operates in a closed loop configuration in a second mode, wherein the clock distribution network is activated during the first mode and is deactivated during the second mode.

17. The integrated circuit die of claim 16, wherein the frequency encoder includes a first adjustable delay circuit, and wherein the frequency decoder includes a second adjustable delay circuit that is identical to the first adjustable delay circuit.

18. The integrated circuit die of claim 17, wherein the frequency decoder comprises:
a multiplexer having an output that is connected to the second adjustable delay circuit, a first input that receives the reference clock signal, and a second input that is directly connected to the second adjustable delay circuit.

19. The integrated circuit die of claim 17, wherein the frequency encoder further includes:
a coarse delay counter;
a fine delay counter; and
a register for storing the values of the coarse delay counter and the fine delay counter.

20. The integrated circuit die of claim 19, wherein the values stored in the register within the frequency encoder are used to control the second adjustable delay circuit within the frequency decoder.

* * * * *